United States Patent
Jang

(10) Patent No.: US 10,923,540 B2
(45) Date of Patent: Feb. 16, 2021

(54) FINGERPRINT RECOGNIZABLE OLED DISPLAY PANEL AND DISPLAY DEVICE

(71) Applicant: Wuhan China Star Optoelectronics Semiconductor Display Technology Co., Ltd., Wuhan (CN)

(72) Inventor: Woosung Jang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 61 days.

(21) Appl. No.: 16/464,697

(22) PCT Filed: Aug. 14, 2018

(86) PCT No.: PCT/CN2018/100484
§ 371 (c)(1),
(2) Date: May 29, 2019

(87) PCT Pub. No.: WO2020/015038
PCT Pub. Date: Jan. 23, 2020

(65) Prior Publication Data
US 2020/0144334 A1    May 7, 2020

(30) Foreign Application Priority Data

Jul. 17, 2018 (CN) .......................... 2018 1 0782099

(51) Int. Cl.
*H01L 27/32* (2006.01)
*G06K 9/00* (2006.01)

(52) U.S. Cl.
CPC .......... *H01L 27/323* (2013.01); *G06K 9/0004* (2013.01); *H01L 27/3262* (2013.01); *H01L 27/3265* (2013.01); *H01L 27/3276* (2013.01)

(58) Field of Classification Search
CPC ............... H01L 27/323; H01L 27/3211; H01L 27/3244; H01L 27/3262; H01L 27/3265;
(Continued)

(56) References Cited

U.S. PATENT DOCUMENTS 7,859,526 B2   12/2010  Konicek
8,148,729 B2 *  4/2012  Kim .................... H01L 27/3276
                                                          257/72
(Continued)

FOREIGN PATENT DOCUMENTS

CN    104732918    6/2015
CN    106156753    11/2016
(Continued)

OTHER PUBLICATIONS

Kimura et al., New pixel driving circuit using self-discharging compensation method for high-resolution OLED micro displays on a silicon backplane, Journal of the Society for Information Display, vol. 25, No. 3, Apr. 18, 2017, 27 pages. (Year: 2017).*

(Continued)

*Primary Examiner* — Mary A Wilczewski

(57) ABSTRACT

In a fingerprint recognizable organic light-emitting diode (OLED) display panel and display device provided by the present disclosure, optical fingerprint recognition is implemented by a fingerprint recognizing sensor formed by poly-Si in a thin film transistor array of the OLED display panel. Space for disposing the fingerprint recognizing sensor is enlarged because the space occupied by the poly-Si in the thin film transistors array is narrowed by reducing the number of thin film transistors. In addition, the optical fingerprint recognizing sensors are disposed within the display panel, therefore, the display panel can implement image display and fingerprint recognition sensing at the same time. As a result, the usage experience is improved because fingerprint recognition sensing can be implemented in dis- (Continued)

play area. The OLED display panel of the present disclosure can be applied in a liquid crystal display panel.

2 Claims, 1 Drawing Sheet

(58) Field of Classification Search
CPC ... H01L 27/3276; G06F 3/0412; G06F 21/32; G09G 3/3208–3/3291; G06K 9/0004
See application file for complete search history.

(56) References Cited

U.S. PATENT DOCUMENTS

| | | | |
|---|---|---|---|
| 2002/0027229 A1* | 3/2002 | Yamazaki | G01J 1/44 257/84 |
| 2004/0201557 A1* | 10/2004 | Lo | G09G 3/3233 345/82 |
| 2009/0128017 A1* | 5/2009 | Sagawa | H01L 27/3276 313/504 |
| 2011/0074838 A1* | 3/2011 | Yamamoto | G09G 3/3233 345/690 |
| 2015/0137099 A1* | 5/2015 | Choi | H01L 27/1225 257/40 |
| 2015/0179102 A1 | 6/2015 | Kim | |
| 2016/0211314 A1* | 7/2016 | Kim | H01L 27/3276 |
| 2016/0253541 A1* | 9/2016 | Yang | G09G 3/3233 382/124 |
| 2017/0092193 A1* | 3/2017 | Na | G09G 3/3233 |
| 2017/0103707 A1 | 4/2017 | Park et al. | |
| 2017/0154606 A1* | 6/2017 | Shin | G09G 3/20 |
| 2017/0301296 A1* | 10/2017 | Pappas | G09G 3/3266 |
| 2017/0345846 A1* | 11/2017 | Yang | H01L 27/1255 |
| 2018/0033850 A1* | 2/2018 | Gang | H01L 27/322 |
| 2018/0061908 A1* | 3/2018 | Shim | G09G 3/3233 |
| 2018/0150668 A1 | 5/2018 | Li et al. | |
| 2018/0150670 A1* | 5/2018 | Jang | H01L 27/323 |
| 2018/0151636 A1* | 5/2018 | Park | H01L 27/3258 |
| 2018/0151661 A1* | 5/2018 | Oh | H01L 27/1214 |
| 2018/0182296 A1* | 6/2018 | Wang | G09G 3/3233 |
| 2018/0211079 A1 | 7/2018 | Liu et al. | |
| 2019/0213954 A1* | 7/2019 | Guo | H01L 29/786 |
| 2019/0287453 A1* | 9/2019 | Weng | G09G 3/3208 |
| 2019/0385532 A1 | 12/2019 | Liu | |
| 2020/0035151 A1 | 1/2020 | Peng et al. | |
| 2020/0051499 A1* | 2/2020 | Chung | G09G 3/3233 |
| 2020/0144334 A1* | 5/2020 | Jang | G06K 9/0004 |
| 2020/0203453 A1* | 6/2020 | Kim | H05K 1/18 |
| 2020/0211432 A1* | 7/2020 | Ma | G09G 3/3233 |
| 2020/0212154 A1* | 7/2020 | Kim | H01L 27/3248 |
| 2020/0286932 A1* | 9/2020 | Zhao | H01L 27/1255 |

FOREIGN PATENT DOCUMENTS

| | | |
|---|---|---|
| CN | 106355136 | 1/2017 |
| CN | 106898636 | 6/2017 |
| CN | 107680530 | 2/2018 |

OTHER PUBLICATIONS

Lee et al., Correlation between the compensation time and the current deviation of organic LED pixel circuit, Journal of the Society for Information Display, Jun. 26, 2020, pp. 1-10. (Year: 2020).*

* cited by examiner

FINGERPRINT RECOGNIZABLE OLED DISPLAY PANEL AND DISPLAY DEVICE

RELATED APPLICATIONS

This application is a National Phase of PCT Patent Application No. PCT/CN2018/100484 having International filing date of Aug. 14, 2018, which claims the benefit of priority of Chinese Patent Application No. 201810782099.3 filed on Jul. 17, 2018. The contents of the above applications are all incorporated by reference as if fully set forth herein in their entirety.

FIELD AND BACKGROUND OF THE INVENTION

The present disclosure relates to display technology field, and particularly to an organic light-emitting diode (OLED) display panel and display device with an internal optical fingerprint recognizing sensor embedded into a panel.

The number of users using fingerprint recognizing technology grows with the development of mobile communication and smart terminals. Currently, fingerprint recognizing functions has become an essential function for smart terminals. Position and usage conveniences of the fingerprint recognizing devices are of growing concerns. To embed fingerprint function into a display area for the purpose of a better usage experience is a target for industries in related area. There are three kinds of main technologies utilized in fingerprint recognizable smart terminals: capacitive, optical, and supersonic.

Optical fingerprint recognition utilizes differences in light refraction and reflection resulting from concavity and convexity of fingerprints, because light emitted from an internal emitting source is reflected or refracted through an optical panel when fingers are put on the optical panel. An electric coupling component receives the reflected or refracted light from the optical panel, thus a grayscale image of a fingerprint where a crest of the fingerprint (the convex lines having width and trend of fingerprint) is blacker and the trough of fingerprint (the concave line of fingerprint) is whiter. As a result, fingerprint images are digitalized into grayscales by algorithm operated by devices. Then, the recognition of fingerprint will be completed after comparing the recognized grayscale image with a database.

Please refer to FIG. 1, which illustrates a structure of an optically fingerprint recognizable organic light-emitting diode (OLED) display panel. The OLED display penal comprises an OLED layer 101 disposed on a substrate, a thin film transistor (TFT) layer 102, polycrystalline layer 103, and fingerprint recognizing sensor 104. The TFT layer is composed by an array of TFTs excluding polycrystalline. That is, polycrystalline layer 103 and the fingerprint recognizing sensor 104 consist of a common layer 110. Light emitting from the display area is diffusely reflected from the finger surface 105 to the fingerprint recognizing sensor 104. A fingerprint of the user will be recognized corresponding to the signals generated by the fingerprint recognizing sensor 104.

OLED display technology implements difference level of illumination intensity by using the injection and exciplex of carriers within a diode driven by applying an electric field to an organic semiconductor and an emitting material. OLED display is viewed as a display technology having the highest development potential, because OLED display devices possess advantages such as self-emitting, lower driving voltage, higher illuminating efficiency, shorter response times, higher display quality, higher contrast ratio, wider viewing angles which are near 180°, wider operation temperature, flexible, and being able to implement full-color on big screen display. OLED is driven by electric current, thus the luminous intensity is determined by the electric current following through the OLED. OLED display panel has problems regarding the Mura effect which refers to uneven luminous intensity. Mura effect causes undesired flow lines in display panel which causes declining display quality and disadvantages for display.

In the present technology, OLED display panels adapts 7T1C (7 transistors and one capacitance) compensation circuits on R, G and B pixels in order to compensate Mura effect. Due to the high number of thin film transistors in the compensation circuits within the OLED display panels, a polycrystalline layer 103 occupies broad space of common layer 110 thus space for disposing fingerprint sensors (image sensor) is limited. The space for disposing fingerprint sensors becomes much limited when resolution, especially more than 700 ppi, of display screen is higher.

SUMMARY OF THE INVENTION

The object of the present disclosure is providing a fingerprint recognizable organic light-emitting diode (OLED) display panel and display device which have more space, in comparison to the present OLED display panel, for disposing fingerprint sensors, thus fingerprint recognition can be implemented in display area.

To implement the above-mentioned object, the present disclosure provides a fingerprint recognizable OLED display panel which characterized in To implement the above-mentioned object, the present disclosure provides a fingerprint recognizable OLED display device which characterized in To implement the above-mentioned object, the present disclosure provides a fingerprint recognizable OLED display panel which characterized in To implement the above-mentioned object, the present disclosure provides a fingerprint recognizable OLED display device which characterized in The advantage of the fingerprint recognizable OLED display panel of the present disclosure is number of required thin film transistors is less by decreasing the space required for fingerprint recognition and decreasing the space for the polycrystalline layer disposed on the common layer, thus the space for disposing the fingerprint recognizing sensors is broader. In addition, the optical fingerprint recognizing sensors are disposed in the display panel so that fingerprint recognition and image display can be executed at the same time on the display panel and usage experience will be improved.

DESCRIPTION OF SPECIFIC EMBODIMENTS OF THE INVENTION

The following context practically introduces parts of embodiments of an organic light-emitting diode (OLED)

display panel and display device of the present disclosure accompanying with exemplifying drawings. It should be understood that the same reference numbers refer to the same components may be used in different drawings. If structures or functions of a component are well-known will not result in confusion even without any illustration, the detailed introduction will be omitted.

Figure 1:
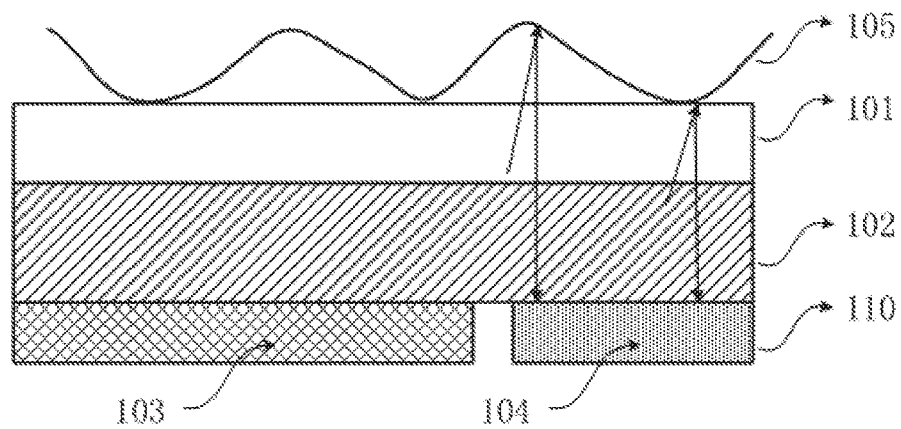
FIG. 1 is a structure illustration of an optical fingerprint recognizable organic light-emitting diode (OLED) display panel.
Figure 2:
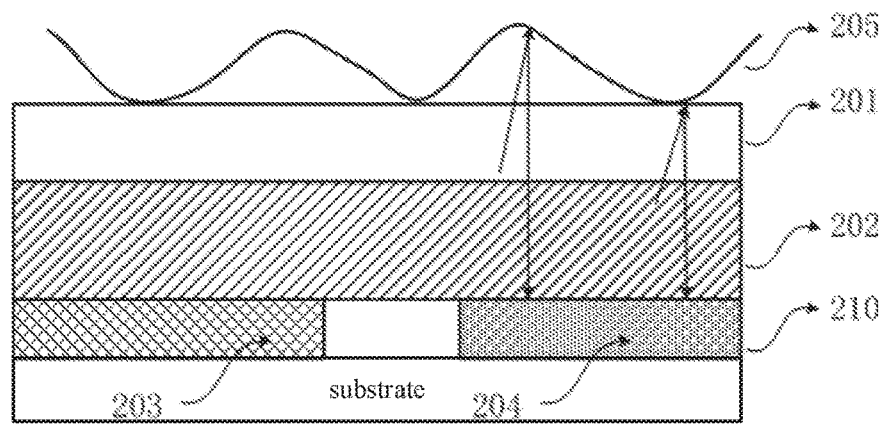
FIG. 2 is a structural illustration of a fingerprint recognizable OLED display panel of an embodiment.

Please refer to FIG. 2 which is a structural illustration of a fingerprint recognizable OLED display panel of an embodiment. The OLED display panel includes a substrate, an OLED layer 201, a thin film transistor (TFT) layer 202, a polycrystalline silicon layer 203, and a fingerprint recognizing sensor 204. The fingerprint recognizing sensor 204 and the polycrystalline silicon layer 203 commonly share a common layer 210 for fingerprint recognition and polycrystalline-silicon layer formation. The OLED display panel includes red (R) pixels, green (G) pixels and blue (B) pixels. The blue pixels utilize a compensation circuit that includes a plurality of transistors and one capacitor to obtain space for formation of the fingerprint recognizing sensor above the common layer. The number of the plurality of transistor is less or equal to 5.

The OLED display panels are manufactured based on polycrystalline silicon thin film transistors. The present disclosure can be utilized on any kind of poly-Si OLED display panels. Compared to non-polycrystalline silicon, transferring efficiency of electron of polycrystalline silicon is higher and the width of the thin film transistor can be limited. The TFT layer 202, which consists of the thin film transistors array excluding polycrystalline silicon thin film transistors, is disposed on the OLED display panel. The optical fingerprint recognition is implemented by fingerprint recognizing sensor made from poly-Si in the thin film transistors array. When users put their fingers on the display area of a screen, the light emitted from display area is diffusely reflected from the finger surface 205 to the fingerprint recognizing sensor 204, then the fingerprint recognizing sensor 204 generates corresponding signals which are utilized to figure out the fingerprint of the user.

The space for disposing the fingerprint recognizing sensor is enlarged because the space occupied by the poly-Si in the thin film transistors array is narrowed by reducing the number of thin film transistors. In addition, the optical fingerprint recognizing sensors are disposed within the display panel, therefore, the display panel can implement image display and fingerprint recognition sensing at the same time. As a result, usage experience is improved because fingerprint recognition sensing can be implement in display area.

From research, we learn that in the R, G, and B pixels of the OLED display panel, the contrast of B pixels is lower in comparison to R and G pixels. Additionally, B pixels have lower sensitivity to Mura effect. Therefore, the space for disposing the fingerprint recognizing sensor can be enlarged by reducing the number of thin film transistors used by compensation circuits of B pixels. In the OLED display panel, the G and R pixels adapt 7T1C compensation circuit, and the B pixels adapt 5T1C (5 transistor 1 capacitance) compensation circuit or compensation circuit with less thin film transistors.

In this embodiment, the G pixels and R pixels adapt 7T1C (7 transistors and 1 capacitor) compensation circuits and the B pixels adapt 3T1C (3 transistors and 1 capacitor) compensation circuit, so that Mura effect can be compensated efficiently and the space for the fingerprint recognizing sensor 204 disposing on the common layer 210 shared with polycrystalline silicon is enlarged.

Particularly, the 3T1C compensation circuit utilized by the blue pixels including a first TFT T1, a second TFT T2 a third TFT T3 and a first compensation capacitor Cst1. A gate of the first TFT T1 is connected with a source of the second TFT T2. A source of the first TFT T1 is connected with an anode of an OLED and a source of the third TFT T3. A drain of the first TFT T1 is connected with a bias source voltage ELVDD. A cathode of the OLED is grounded. The first TFT T1 here is a drive TFT. A gate of the second TFT T2 receives a first scan signal Scan1. A drain of the second TFT T2 receives data signal Data. A gate of the third TFT T3 receives a second scan single Scan2. A drain of the third TFT T3 receives a reference voltage Vref. The first compensation capacitor Cst1 is disposed between the gate and the source of the first TFT T1. By adapting 3T1C compensation circuit, a larger space for fingerprint recognizing sensors will be obtained because space that the TFTs of B pixels is reduced during the compensation of Mura effect.

Figure 3:
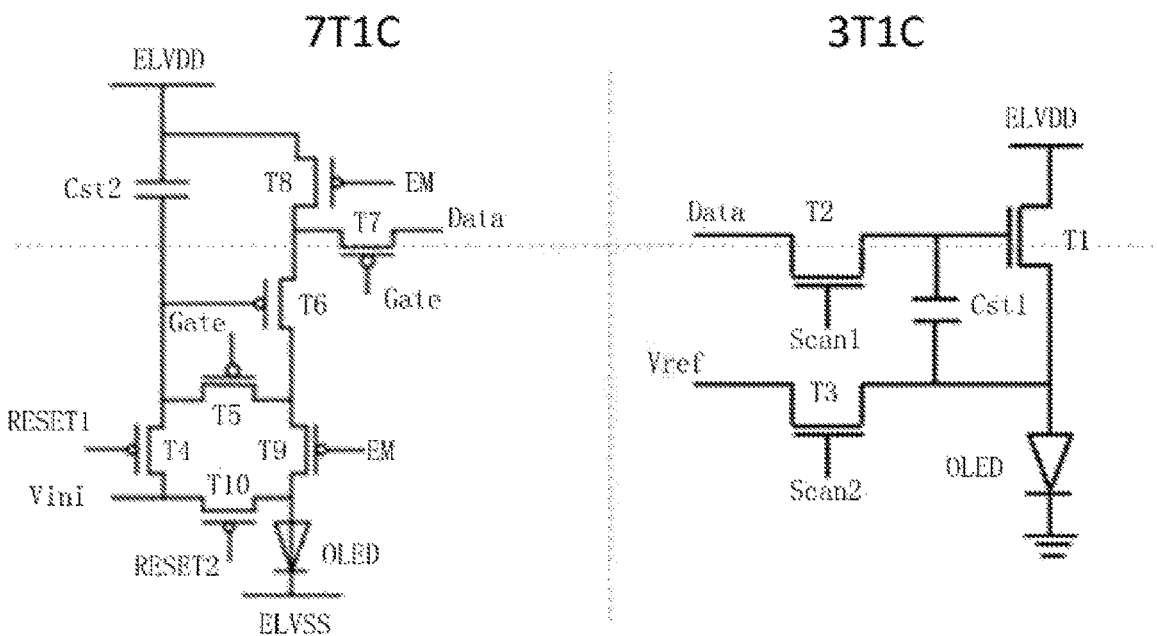
FIG. 3 is a circuit illustration of a fingerprint recognizable OLED display panel of an embodiment.

Please refer to FIG. 3 which is a circuit illustration of a fingerprint recognizable OLED display panel of an embodiment. In this embodiment, the G pixels and R pixels adapt 7T1C (7 transistors and 1 capacitor) compensation circuits and the B pixels adapt 3T1C (3 transistors and 1 capacitor) compensation circuit, so that Mura effect can be compensated efficiently and the space for the fingerprint recognizing sensor 204 disposing on the common layer 210 shared with polycrystalline silicon is enlarged.

Particularly, the 3T1C compensation circuit utilized by the blue pixels including a first TFT T1, a second TFT T2 a third TFT T3 and a first compensation capacitor Cst1. A gate of the first TFT T1 is connected with a source of the second TFT T2. A source of the first TFT T1 is connected with an anode of an OLED and a source of the third TFT T3. A drain of the first TFT T1 is connected with a bias source voltage ELVDD. A cathode of the OLED is grounded. The first TFT T1 here is a drive TFT. A gate of the second TFT T2 receives a first scan signal Scan1. A drain of the second TFT T2 receives data signal Data. A gate of the third TFT T3 receives a second scan single Scan2. A drain of the third TFT T3 receives a reference voltage Vref. The first compensation capacitor Cst1 is disposed between the gate and the source of the first TFT T1. By adapting 3T1C compensation circuit, a larger space for fingerprint recognizing sensors will be obtained because space that the TFTs of B pixels is reduced during the compensation of Mura effect.

Particularly, the compensation circuits of the red pixel and the green pixel which utilizes seven TFTs and one capacitor are as flowing: A fourth TFT T4 where a gate of the fourth TFT T4 receives a first reset signal, a source of the fourth TFT T4 is connected to a source of a fifth TFT T5 and a gate of a sixth TFT T6, and a drain of the fourth TFT T4 is connected to an initializing voltage Vini and a drain of a tenth TFT T10. A gate of the fifth TFT T5 receives a gate driving signal Gate, and a drain of the fifth TFT T5 is connected to a drain of the sixth TFT T6 and a drain of a ninth TFT T9. A source of the sixth TFT T6 is connected to a source of a seventh TFT T7 and a source of an eighth TFT T8. A gate of the seventh TFT T7 receives the gate driving signal Gate, and a drain of the seventh TFT T7 receives the data signal Date. A gate of the eighth TFT T8 receives a control signal EM, and a drain of the eighth TFT T8 receives the bias source voltage ELVDD. A gate of the ninth TFT T9 receives the control signal EM, a source of the ninth TFT T9 is connected to a source of the tenth TFT T10 and an anode of an OLED. A cathode of the OLED is connected to a bias ground voltage ELVSS. A gate of the tenth TFT T10 receives a second reset voltage RESET2. A second compensation capacitor Cst2 is disposed between the drain of the eighth TFT T8 and a gate of the sixth TFT T6. The Mura effect happens in red and green pixels can be effetely compensated by adapting the 7T1C compensation circuit.

In the fingerprint recognizable OLED display panel of the present disclosure, the optical fingerprint recognition is implemented by the fingerprint recognizing sensor formed by the poly-Si in the thin film transistors array of the OLED display panel. The space for disposing the fingerprint recognizing sensor is enlarged because the space occupied by the poly-Si in the thin film transistors array is narrower by reducing the number of thin film transistors. In addition, the optical fingerprint recognizing sensors are disposed within the display panel, therefore, the display panel can implement image display and fingerprint recognition sensing at the same time. As a result, the usage experience is improved because fingerprint recognition sensing can be implemented in display area. The OLED display panel of the present disclosure can be applied in a liquid crystal display panel.

To conclude, the above-mentioned embodiments are utilized to exemplify rather than limit the technology concept of the present disclosure. Any modification and variation which can be completed by a skilled person in the art on the basis of the specification should fall into the scope of the claims protected by the present disclosure.

What is claimed is:

1. A fingerprint recognizable organic light-emitting diode (OLED) display panel, comprising a substrate, an OLED layer, a thin film transistor (TFT) layer, a polycrystalline silicon layer, and a fingerprint recognizing sensor disposed on the substrate, wherein the fingerprint recognizing sensor and the polycrystalline silicon layer are disposed at a same layer to form a common layer, wherein the fingerprint recognizable OLED display panel further comprises red (R) pixels, green (G) pixels and blue (B) pixels, each of the blue pixels comprises a compensation circuit comprising a first TFT, a second TFT, a third TFT, and a first compensation capacitor, a gate of the first TFT is connected to a source of the second TFT, a source of the first TFT is connected to an anode of an OLED and a source of the third TFT, a drain of the first TFT is connected to a bias source voltage, a cathode of the OLED is grounded, and the first TFT is a drive TFT;

wherein a gate of the second TFT is configured to receive a first scan signal, a drain of the second TFT is configured to receive a data signal, a gate of the third TFT is configured to receive a second scan signal, a drain of the third TFT is configured to receive a reference voltage, and the first compensation capacitor is disposed between the gate and the source of the first TFT;

wherein each of the red pixels and the green pixels comprises a compensation circuit comprising a fourth TFT, a fifth TFT, a sixth TFT, a seventh TFT, an eighth TFT, a ninth TFT, a tenth TFT, and a second compensation capacitor;

wherein a gate of the fourth TFT is configured to receive a first reset signal, a source of the fourth TFT is connected to a source of the fifth TFT and a gate of the sixth TFT, and a drain of the fourth TFT is configured to receive an initializing voltage and a drain of the tenth TFT;

wherein a gate of the fifth TFT is configured to receive a gate driving signal, and a drain of the fifth TFT is connected to a drain of the sixth TFT and a drain of the ninth TFT;

wherein a source of the sixth TFT is connected to a source of the seventh TFT and a source of the eighth TFT;

wherein a gate of the seventh TFT is configured to receive the gate driving signal, and a drain of the seventh TFT is configured to receive the data signal;

wherein a gate of the eighth TFT is configured to receive a control signal, and a drain of the eighth TFT is configured to receive the bias source voltage;

wherein a gate of the ninth TFT is configured to receive the control signal, a source of the ninth TFT is connected to a source of the tenth TFT and an anode of an OLED of the red pixel or the green pixel, and a cathode of the OLED of the red pixel or the green pixel is connected to a bias ground voltage;

wherein a gate of the tenth TFT is configured to receive a second reset voltage; and wherein the second compensation capacitor is disposed between the drain of the eighth TFT and the gate of the sixth TFT.

2. A display device comprising an organic light-emitting diode (OLED) display panel, wherein the OLED display panel comprises a substrate, an OLED layer, a thin film transistor (TFT) layer, a polycrystalline silicon layer and a fingerprint recognizing sensor disposed on the substrate, and the fingerprint recognizing sensor and the polycrystalline silicon layer are disposed at a same layer to form a common layer, wherein the OLED display panel further comprises red (R) pixels, green (G) pixels and blue (B) pixels, each of the blue pixels comprises a compensation circuit comprising a first TFT, a second TFT, a third TFT, and a first compensation capacitor, a gate of the first TFT is connected to a source of the second TFT, a source of the first TFT is connected to an anode of an OLED and a source of the third TFT, a drain of the first TFT is connected to a bias source voltage, a cathode of the OLED is grounded, and the first TFT is a drive TFT;

wherein a gate of the second TFT is configured to receive a first scan signal, a drain of the second TFT is configured to receive a data signal, a gate of the third TFT is configured to receive a second scan signal, a drain of the third TFT is configured to receive a reference voltage, and the first compensation capacitor is disposed between the gate and the source of the first TFT;

wherein each of the red pixels and the green pixels comprises a compensation circuit comprising a fourth TFT, a fifth TFT, a sixth TFT, a seventh TFT, an eighth TFT, a ninth TFT, a tenth TFT, and a second compensation capacitor;

wherein a gate of the fourth TFT is configured to receive a first reset signal, a source of the fourth TFT is connected to a source of the fifth TFT and a gate of the sixth TFT, and a drain of the fourth TFT is connected to an initializing voltage and a drain of the tenth TFT;

wherein a gate of the fifth TFT is configured to receive a gate driving signal, and a drain of the fifth TFT is connected to a drain of the sixth TFT and a drain of the ninth TFT;

wherein a source of the sixth TFT is connected to a source of the seventh TFT and a source of the eighth TFT;

wherein a gate of the seventh TFT is configured to receive the gate driving signal, and a drain of the seventh TFT is configured to receive the data signal;

wherein a gate of the eighth TFT is configured to receive a control signal, and a drain of the eighth TFT is configured to receive the bias source voltage;

wherein a gate of the ninth TFT is configured to receive the control signal, a source of the ninth TFT is connected to a source of the tenth TFT and an anode of an OLED of the red pixel or the green pixel, and a cathode of the OLED of the red pixel or the green pixel is connected to a bias ground voltage;

wherein a gate of the tenth TFT is configured to receive a second reset voltage; and wherein the second compensation capacitor is disposed between the drain of the eighth TFT and the gate of the sixth TFT.

* * * * *